(12) United States Patent
Hubert et al.

(10) Patent No.: US 7,686,654 B2
(45) Date of Patent: *Mar. 30, 2010

(54) MEMORY CARD FOR AN EXPRESSCARD SLOT

(75) Inventors: Jonathan Hubert, Los Gatos, CA (US); Jason P. Hanlon, Scotts Valley, CA (US); Jordan Macdonald, Menlo Park, CA (US); Wesley G. Brewer, Menlo Park, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/771,756

(22) Filed: Jun. 29, 2007

(65) Prior Publication Data

US 2009/0002933 A1    Jan. 1, 2009

(51) Int. Cl.
*H01R 25/00* (2006.01)
(52) U.S. Cl. ............................ 439/638; 361/737
(58) Field of Classification Search ............... 439/76.1, 439/638, 945; 361/737
See application file for complete search history.

(56) References Cited

U.S. PATENT DOCUMENTS

| | | | |
|---|---|---|---|
| 5,581,127 A | 12/1996 | Shinohara | |
| 5,905,253 A | 5/1999 | Ito et al. | |
| 6,101,372 A | 8/2000 | Kubo | |
| 6,179,665 B1 | 1/2001 | Rossman et al. | |
| 6,234,844 B1 | 5/2001 | Somerville et al. | |
| 6,264,506 B1 * | 7/2001 | Yasufuku et al. | 439/638 |
| 6,402,558 B1 | 6/2002 | Hung-Ju et al. | |
| 6,438,638 B1 | 8/2002 | Jones et al. | |
| 6,567,273 B1 | 5/2003 | Liu et al. | |
| 6,574,112 B2 * | 6/2003 | Washino et al. | 361/752 |
| 6,692,268 B2 | 2/2004 | Kung et al. | |
| 6,725,286 B2 | 4/2004 | Takahashi | |
| 6,736,678 B2 | 5/2004 | Yao | |
| 6,751,694 B2 | 6/2004 | Liu et al. | |
| 6,768,644 B2 * | 7/2004 | Kakinoki et al. | 361/737 |
| 6,808,424 B2 | 10/2004 | Kaneshiro et al. | |
| 6,859,369 B2 | 2/2005 | Mambakkam et al. | |
| 6,908,038 B1 | 6/2005 | Le | |
| 6,976,624 B2 | 12/2005 | Hsiao | |
| 6,993,618 B2 | 1/2006 | Chen et al. | |
| 7,044,767 B2 | 5/2006 | Wong et al. | |
| 7,059,913 B1 * | 6/2006 | Chen | 439/638 |
| 7,075,793 B2 | 7/2006 | Le et al. | |
| 7,092,256 B1 | 8/2006 | Salazar et al. | |
| 7,108,530 B2 | 9/2006 | Kimura et al. | |

(Continued)

FOREIGN PATENT DOCUMENTS

EP    1587020 A    10/2005

(Continued)

OTHER PUBLICATIONS

U.S. Appl. No. 11/620,519, filed Jan. 5, 2007.

(Continued)

*Primary Examiner*—Thanh-Tam T Le
(74) *Attorney, Agent, or Firm*—Vierra Magen Marcus & DeNiro LLP (57) ABSTRACT

A memory card is disclosed resembling a CompactFlash card, but which is compatible with an ExpressCard slot.

3 Claims, 4 Drawing Sheets

U.S. PATENT DOCUMENTS

| | | | |
|---|---|---|---|
| 7,108,557 | B2 | 9/2006 | Kikuchi et al. |
| 7,112,075 | B1 | 9/2006 | Su |
| 7,125,258 | B2 | 10/2006 | Nakakubo et al. |
| 7,172,430 | B2 | 2/2007 | Kojima |
| 7,182,645 | B2 | 2/2007 | Shimizu et al. |
| 7,217,150 | B2 | 5/2007 | Lekic et al. |
| 7,265,989 | B2 * | 9/2007 | Son et al. ............. 361/737 |
| 7,281,953 | B1 | 10/2007 | Jochym et al. |
| 7,300,314 | B2 | 11/2007 | Kim |
| 7,306,467 | B2 * | 12/2007 | Morino et al. .......... 439/64 |
| 7,326,086 | B1 | 2/2008 | Lee |
| 7,341,461 | B1 | 3/2008 | Yen et al. |
| 7,354,312 | B2 | 4/2008 | Chuang |
| 7,367,511 | B2 * | 5/2008 | Thornton et al. ....... 235/487 |
| 7,382,625 | B2 | 6/2008 | Thornton et al. |
| 7,385,827 | B2 | 6/2008 | Klatt |
| 7,416,451 | B2 | 8/2008 | Tanaka et al. |
| 7,460,076 | B2 * | 12/2008 | Hayes et al. ........... 343/702 |
| 7,475,816 | B1 | 1/2009 | Rochelo |
| 7,534,116 | B2 | 5/2009 | Ho |
| 2002/0002061 | A1 * | 1/2002 | Miyasaka et al. ....... 455/557 |
| 2002/0076954 | A1 | 6/2002 | Chen et al. |
| 2003/0201322 | A1 | 10/2003 | Wu |
| 2004/0087213 | A1 | 5/2004 | Kao |
| 2005/0048833 | A1 | 3/2005 | Kimura et al. |
| 2005/0066102 | A1 | 3/2005 | Yamamoto et al. |
| 2005/0114587 | A1 | 5/2005 | Chou et al. |
| 2005/0251609 | A1 | 11/2005 | Chou et al. |
| 2005/0258243 | A1 | 11/2005 | Hsieh |
| 2008/0123274 | A1 | 5/2008 | Desrosiers et al. |
| 2008/0168204 | A1 | 7/2008 | Sultenfuss et al. |
| 2008/0228986 | A1 | 9/2008 | Lodolo |
| 2008/0270663 | A1 | 10/2008 | Fry et al. |

FOREIGN PATENT DOCUMENTS

| | | |
|---|---|---|
| WO | 9744867 A | 11/1997 |
| WO | 2005106781 A | 11/2005 |

OTHER PUBLICATIONS

U.S. Appl. No. 11/620,530, filed Jan. 5, 2007.
U.S. Appl. No. 11/771,763, filed Jun. 29, 2007.
U.S. Appl. No. 11/771,767, filed Jun. 29, 2007.
U.S. Appl. No. 11/771,717, filed Jun. 29, 2007.
U.S. Appl. No. 11/771,730, filed Jun. 29, 2007.
U.S. Appl. No. 11/771,744, filed Jun. 29, 2007.
U.S. Appl. No. 11/771,752, filed Jun. 29, 2007.
Office Action mailed Dec. 28, 2007 in U.S. Appl. No. 11/620,530, filed Jan. 5, 2007.
Office Action mailed Jan. 14, 2008 in U.S. Appl. No. 11/620,519, filed Jan. 5, 2007.
Response to Office Action dated Feb. 14, 2008 in U.S. Appl. No. 11/620,519, filed Jan. 5, 2007.
Response to Office Action dated Apr. 25, 2008, U.S. Appl. No. 11/620,530, filed Jan. 5, 2007.
Office Action dated May 13, 2008, U.S. Appl. No. 11/771,717, filed Jun. 29, 2007.
International Search Report and Written Opinion dated Jul. 3, 2008 in PCT Application No. PCT/US2007/089069.
Office Action dated Jul. 9, 2008 in U.S. Appl. No. 11/620,519.
Final Office Action dated Aug. 7, 2008 in U.S. Appl. No. 11/620,530.
Response to Office Action dated Aug. 13, 2008 in U.S. Appl. No. 11/771,717.
Response to Office Action dated Sep. 30, 2008 in U.S. Appl. No. 11/620,519.
Office Action dated Dec. 29, 2008 in U.S. Appl. No. 12/103,533.
International Search Report and Written Opinion dated Dec. 16, 2008 in PCT Application No. PCT/US2008/068531.
Office Action dated Jan. 8, 2009 in U.S. Appl. No. 11/620,519.
Amendment filed Feb. 17, 2009 in U.S. Appl. No. 11/771,730.
Response of Office Action filed Mar. 30, 2009 in U.S. Appl. No. 12/103,533.
Office Action dated Apr. 1, 2009 in U.S. Appl. No. 11/771,744.
Response of Office Action filed Apr. 8, 2009 in U.S. Appl. No. 11/620,159.
Notice of Allowance dated Nov. 14, 2008 in U.S. Appl. No. 11/771,730.
Final Office Action dated Nov. 21, 2008 in U.S. Appl. No. 11/771,717.
Notice of Allowance and Fee(s) Due dated Jun. 17, 2009 in U.S. Appl. No. 11/771,730.
Response of Office Action filed Jun. 25, 2008 in U.S. Appl. No. 11/771,744.
Office Action dated Jul. 7, 2009 in U.S. Appl. No. 11/771,767.
Office Action dated Jul. 7, 2009 in U.S. Appl. No. 11/620,519.
Office Action dated Jul. 10, 2009 in U.S. Appl. No. 12/103,533.
Response to Office Action filed Aug. 3, 2009 in U.S. Appl. No. 11/771,767.
Office Action dated Sep. 2, 2009 in U.S. Appl. No. 11/771,744.
Notice of Allowance and Fee(s) Due dated Sep. 14, 2009 in U.S. Appl. No. 11/771,730.
Response to Office Action filed Oct. 7, 2009 in U.S. Appl. No. 11/620,519.
Response to Office Action filed Oct. 13, 2009 in U.S. Appl. No. 12/103,533.
Notice of Allowance and Fee(s) Due dated Oct. 19, 2009 in U.S. Appl. No. 11/771,767.
Office Action date Oct. 22, 2009 in U.S. Appl. No. 11/771,752.
Notice of Allowance and Fee(s) Due dated Dec. 3, 2009 in U.S. Appl. No. 11/771,767.
Response to Office Action filed Dec. 2, 2009 in U.S. Appl. No. 11/771,744.

* cited by examiner

MEMORY CARD FOR AN EXPRESSCARD SLOT

CROSS-REFERENCE TO RELATED APPLICATIONS

The following applications are cross-referenced and incorporated by reference herein in their entirety:

U.S. patent application Ser. No. 11/771,763, entitled "Method of Adapting an ExpressCard Slot for Smaller Form Factor Memory Compatibility," by Jonathan Hubert, et al., filed on even date herewith.

U.S. patent application Ser. No. 11/771,767, entitled "Adapter for an ExpressCard Slot," by Jonathan Hubert, et al., filed on even date herewith.

U.S. patent application Ser. No. 11/771,717, entitled "Method of Adapting an ExpressCard Slot for Use with Portable Memory Cards," by Jonathan Hubert, et al., filed on even date herewith.

U.S. patent application Ser. No. 11/771,230, entitled "Adapter System for Use with an ExpressCard Slot," by Jonathan Hubert, et al., filed on even date herewith.

U.S. patent application Ser. No. 11/771,244, entitled "Method of Using the Dual Bus Interface in an ExpressCard Slot," by Jonathan Hubert, et al., filed on even date herewith.

U.S. patent application Ser. No. 11/771,252, entitled "Dual Bus ExpressCard Peripheral Device," by Jonathan Hubert, et al., filed on even date herewith.

BACKGROUND OF THE INVENTION

1. Field of the Invention

Embodiments of the present invention relate in general to a memory card which may be used in an ExpressCard slot.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large storage capacity, have made such memory devices ideal for use in a wide variety of electronic devices, including for example digital cameras, digital music players, video game consoles, PDAs and cellular telephones.

One popular type of flash memory device is the Compact-Flash® memory card manufactured by SanDisk Corporation, Milpitas, Calif. While used in a variety of different applications, the CompactFlash memory card has been adopted as the de facto standard in the professional and consumer imaging markets. While there are several reasons why this is so, including the large storage capacity and low cost per megabyte, the form factor of the CompactFlash memory card has proven to be a significant contributing factor. At 43 mm by 36 mm, the card is large enough for easy manipulation, yet small enough for convenient transport and use in current high resolution digital cameras. Professionals and consumers are comfortable with and have grown accustomed to this size memory card.

While the demand for the look and feel of the Compact-Flash card is likely to continue, CompactFlash cards use a parallel bus interface which is becoming outdated. In particular, serial bus interfaces have been developed that provide faster data transfer rates and better performance. Accordingly, professionals and consumers are looking for a memory card having the look and feel of a CompactFlash, but with the speed and performance of a serial bus interface.

A few years ago, a coalition of member companies of the Personal Computer Memory Card International Association (PCMCIA) developed the ExpressCard® peripheral as a new standard for PC card technology. An example of an Express-Card memory card 20 is shown in prior art FIG. 1. The card 20 fits within an ExpressCard slot 22 in a host device 24, which may be a notebook computer, desktop computer, or various other computing devices. In contrast to older PC cards having a parallel bus interface, ExpressCard technology uses a PCI-Express (PCIe) serial bus interface. The PCIe interface has a simple connector and eliminates the older PC card controller by using direct connections to PCIe and USB ports in the host device. As indicated above, the PCIe interface provides faster transfer rates, better performance and lower cost for the card slot implementations in host systems as compared to older generation PC cards.

Given these advantages, there are compelling technology and business reasons why the popularity of the ExpressCard standard will continue to grow. However, standard Express-Cards come in two sizes: the ExpressCard/34 is 75 mm long by 34 mm wide, and the ExpressCard/54 is 75 mm long by 54 mm wide. Both of these are significantly larger than the CompactFlash card. As such, consumers and professionals who have grown accustomed to the CompactFlash form factor may be slow to adopt the ExpressCard standard. It would therefore be advantageous to provide an adapter which allows a memory card having the size, look and feel of the Compact-Flash card to be compatible with the ExpressCard standard.

Figure 1:
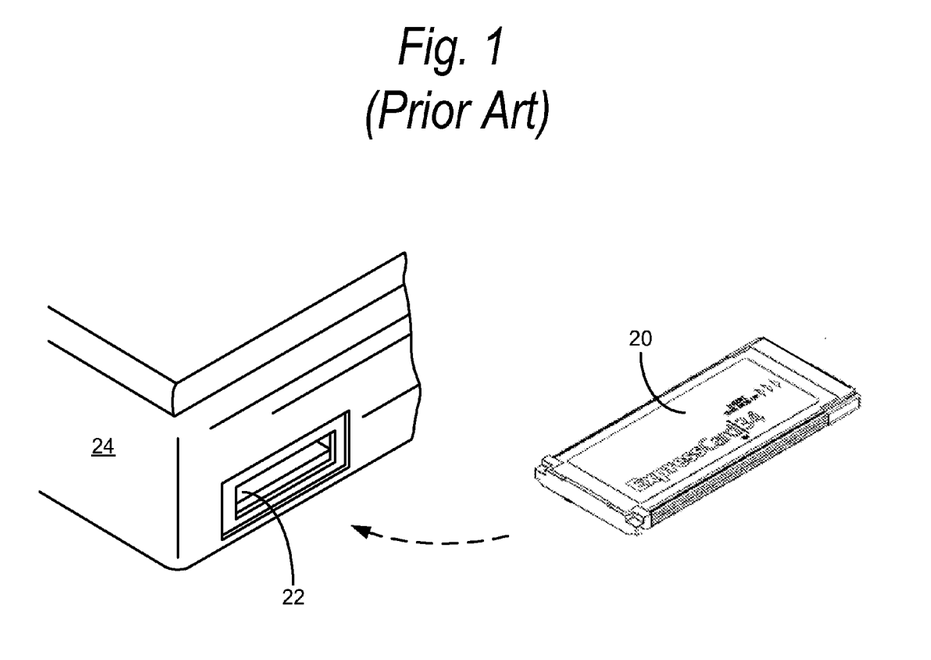
FIG. 1 is a perspective view of a conventional ExpressCard adjacent an ExpressCard slot of a host computing device.

It is known to provide conventional ejector mechanisms within an ExpressCard slot such as slot 22 of FIG. 1. An older type of ejector mechanism commonly employed with legacy PCMCIA cards and still in use includes an ejector button beside the slot. In order to eject a card seated within a slot, a user depresses the ejector button, which actuates a cantilever that in turn exerts an ejection force on a front surface of the card. (As used herein, the "front" of the card/adapter refers to the portion of the card/adapter inserted first into the slot and located at the rear of the slot when inserted; the "back" of the card/adapter refers to a portion of the card/adapter located at the front opening of the slot when the card/adapter is inserted).

Another type of ejector mechanism commonly used in ExpressCard slots is the so-called "push-push" ejector mechanism. While various configurations are known, in general, a spring loaded, translating pin or tab is provided at the rear and to the side of the slot. When a card is initially inserted, a front portion of the card engages the tab and translates the tab rearward against the force of the spring. At some point during the rearward motion of the tab, an actuator locks the tab in place against the force of the spring, and a frictional force of the card edges within the slot holds the card in the slot. In order to release the card, a force is again exerted by a user against a rear of the card, protruding slightly from the slot. This action again translates the tab rearward and moves the actuator from the locking position to an ejection position where the tab is released. Thereafter, the spring-driven tab ejects the card from the slot, overcoming the frictional force maintaining the card within the slot. Further details relating to an example of a push-push ejector mechanism for use in a memory card slot are disclosed in U.S. Pat. No. 7,077,671 to Su et al., entitled, "Memory Card Connector with a Push-Push Mechanism."

The functions of ejector mechanisms may be incompatible with an adapter for use in a memory card slot. In particular, where an adapter is used in a memory card slot, pushing an ejector button or a memory card within the slot may eject not only the memory card but the adapter as well. This may be inconvenient, in as much as a user may wish an adapter to remain within the card slot while memory cards are inserted into and removed from the slot.

SUMMARY OF THE INVENTION

Embodiments of the present invention, roughly described, relate to a memory card resembling a CompactFlash card, but which is compatible with an ExpressCard slot. The memory card in embodiments may be 45 mm long, 34 mm wide and 4 mm thick. In combination with an adapter assembly, the memory card may work within the ExpressCard slot as would other conventional ExpressCard memory cards. However, when not in use with the adapter assembly, the memory card has dimensions which are approximately the same as a conventional CompactFlash card. Thus, users accustomed to the size, look and feel of a conventional CompactFlash card may still use a card of approximately that size in their digital cameras, video cameras or other devices, while at the same time availing themselves of the advantages that the ExpressCard interface has to offer.

The adapter assembly enables the memory card having a smaller length than a standard ExpressCard to be compatible with the standard ExpressCard slot. The adapter assembly includes an adapter, a tongue rigidly mounted to the adapter, and a finger grip affixed to the tongue. The adapter may have a length of 30 mm, a width of 34 mm and a height of 5 mm, and thus fits snugly within a back end of an ExpressCard slot. The adapter includes a first interface for mating with the ExpressCard slot interface connector, and a second interface for mating with an interface of a memory card affixed to the adapter assembly.

The adapter also includes side rails serving multiple functions. The side rails engage within channels in the ExpressCard slot to ensure a sturdy, precise feel upon insertion and removal of the adapter. The side rails also provide frictional engagement with the ExpressCard slot to maintain the adapter securely within the slot. The side rails are also configured to disable (i.e., render ineffective) any ejector mechanisms which may be provided within the ExpressCard slot. Thus, the adapter assembly operates as a "set-it-and-forget-it" device, in that, once inserted into the ExpressCard slot, memory cards may be inserted and removed while the adapter remains positioned in the slot and requires no action or attention by the user.

The user may manually remove the adapter assembly by pulling on the finger grip positioned outside the ExpressCard slot upon insertion of the adapter assembly into the slot. The tongue is provided for rigidly connecting the adapter to the finger grip. The tongue is preferably rigid to transmit an insertion force exerted on the finger grip to the adapter to allow complete insertion of the first interface around the ExpressCard slot interface connector.

DETAILED DESCRIPTION

Embodiments will now be described with reference to FIGS. 2 through 10, which relate to an adapter for a memory card slot and a method of configuring a memory card slot. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 2:
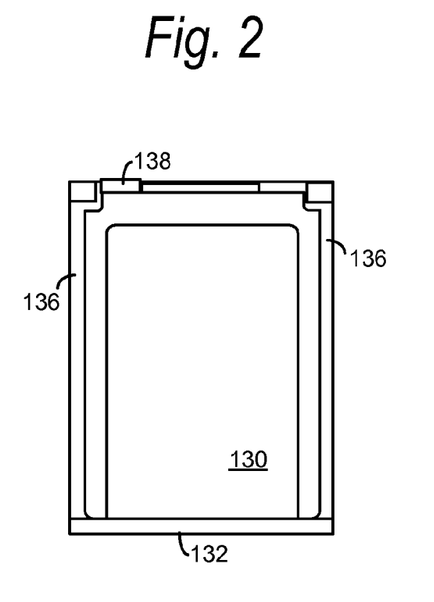
FIG. 2 is a top view of a memory card according to embodiments of the present invention for use with an ExpressCard slot.
Figure 3:
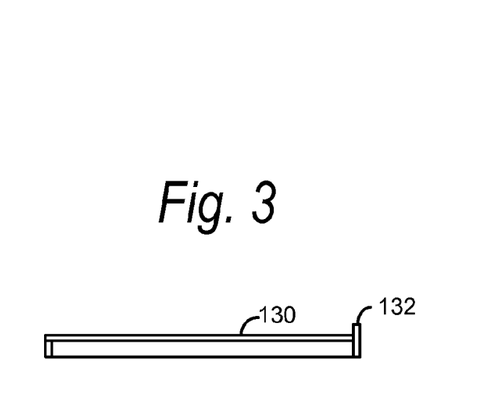
FIG. 3 is a side view of a memory card according to embodiments of the present invention for use with an ExpressCard slot.
Figure 4:
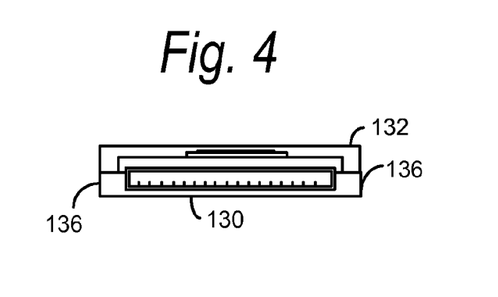
FIG. 4 is an end view of a memory card according to embodiments of the present invention for use with an ExpressCard slot.

Referring now to the top, side and end views of FIGS. 2-4 respectively, embodiments of the present invention relate to a memory card resembling a CompactFlash card, but which is compatible with an ExpressCard slot. The memory card in embodiments may be 45 mm long, 34 mm wide and 4 mm thick. In combination with the adapter assembly 100, described hereinafter, the memory card may work within the ExpressCard slot as would other conventional ExpressCard memory cards. However, when not in use with the adapter assembly, the memory card has dimensions which are approximately the same as a conventional CompactFlash card. Thus, users accustomed to the size, look and feel of a conventional CompactFlash card may still use a card of approximately that size in their digital cameras, video cameras or other devices, while at the same time availing themselves of the advantages that the ExpressCard interface has to offer.

As seen in FIGS. 2-4, memory card 130 may include a lip 132 at its rear edge serving at least two functions. A first function is to prevent a memory card 130 from being inserted into the ExpressCard slot in the absence of the adapter assembly 100. In particular, memory card 130 has a smaller length and height than the ExpressCard slot. If memory card 130 were allowed to be inserted into the slot in the absence of adapter assembly 100, the card may get lost within the slot. By providing lip 132 with a height at least as great as the height of the ExpressCard slot, e.g., greater than 5 mm, the lip prevents memory card 130 from getting lost within the ExpressCard slot. A second function of lip 132 is to provide a grip for a user to pull card 130 out of the ExpressCard slot.

Memory card 130 may further include side rails 136 which prevent memory card 130 from being inserted up-side-down within the ExpressCard slot. In embodiments, memory card 130 may also have an LED 138 for indicating when data transfer is occurring to and from memory card 130.

Through the adapter assembly 100 explained below, the memory card 130 may be compatible with the ExpressCard standard, and still have the look and feel of a CompactFlash card. It is understood that the adapter assembly and memory card of the present invention may operate according to standards other than the ExpressCard standard. The adapter assembly may allow compatibility between a memory card slots of various sizes and memory cards not specified for use with those memory card slots.

Referring now to the top, perspective, end and side views of FIGS. 5-8, respectively, there is shown an adapter assembly 100 for use in combination with memory card 130 within a standard ExpressCard slot such as shown in prior art FIG. 1. Adapter assembly 100 generally includes an adapter 102, a tongue 104 and a finger grip 106. Each of these components is explained in greater detail below.

Adapter 102 includes a first interface 110 at a front of the adapter assembly 100 including female electrical connectors for mating with pins within a standard ExpressCard slot. In embodiments, interface 110 will be configured to receive the standard, 26 pin, beam-on blade style connector used in the ExpressCard slot. As explained hereinafter, it is contemplated that the adapter assembly 100 may be used in other types of card slots which may include other types of interface connectors at a front of the adapter in alternative embodiments.

Adapter 102 further includes an interface 112 at a back of the adapter 102 including male connectors for mating with and electrically coupling to one of a variety of memory card formats. In one embodiment, interface 112 may be configured to mate with memory card 130, having dimensions of 45 mm long, 34 mm wide and 4 mm thick. For such an application, interface 112 may employ a standard connector, such as the connector used in the ExpressCard slot used for 5 mm thick memory cards, but which has been modified to be thinner so as to operate with a 4 mm thick card. The interface 112 may resemble a standard 5 mm connector in all other respects, such as the number and type of pin contacts and the contact force established by the pin contacts. In alternative embodiments, the adapter assembly 100 according to the present invention may operate with memory cards other than memory card 130, such as for example a CompactFlash memory card, a Secure Digital memory card, or a variety of other standard cards. In such embodiments, interface 112 may be a standard connector for interfacing with these cards.

Adapter 102 further includes a housing 114 extending between interfaces 110 and 112. Housing 114 may have a length of approximately 30 mm, a width standard for ExpressCard slots of 34 mm, and a height standard for ExpressCard slots of 5 mm. The length of housing 114 may vary in alternative embodiments and the width and height may vary to match any change in the ExpressCard slot standard. Housing 114 may have an exterior surface formed of metal, or a plastic or other polymer. As seen for example in the end view of FIG. 7, the interior of housing 114 may be substantially empty except for a plurality of leads connecting respective electrical connections from interface 110 to interface 112. Thus, when adapter assembly 100 is plugged into an ExpressCard slot, a memory card connected to interface 112 may exchange signals with the host device in the same manner as if the memory card were connected directly to the host device.

Housing 114 may further include partial side rails 116a and 116b along both edges of housing 114. Partial side rails 116a, 116b serve at least four functions. First, side rails 116a, 116b mate within channels provided in the ExpressCard slot to provide a sturdy, precision feel to a user inserting the adapter assembly 100 into the card slot and removing assembly 100 from the slot. Side rails 116a, 116b may also prevent the assembly 100 from being inserted up-side-down within the ExpressCard slot.

Third, side rails 116a and 116b frictionally engage the channels within the ExpressCard slot to securely hold adapter assembly 100 within the ExpressCard slot at all times other than intentional removal of adapter assembly 100. It is contemplated that the frictional engagement pressure between side rails 116a and 116b may be increased in embodiments to be greater than that between an ExpressCard memory card and the ExpressCard slot. In such embodiments, side rails 116a and/or 116b may be made wider or thicker than is known in conventional ExpressCard memory cards to thereby increase the frictional engagement. In a further embodiment, one or more bumps or raised sections may be provided along the otherwise uniform side rails 116a and/or 116b to increase frictional engagement of rails 116a, 116b with the ExpressCard slot.

A fourth function of side rails 116a and 116b is to defeat the ejector mechanisms conventionally provided in all ExpressCard slots. As discussed in the Background of the Invention section, conventional ExpressCard slots include either ejector buttons or push-push mechanisms for ejecting ExpressCard memory cards from the slot. However, in embodiments of the present invention, it is desirable to allow "set-it-and-forget-it" functionality for adapter assembly 100. That is, it is desirable to allow a user to insert adapter assembly 100 into an ExpressCard slot, and thereafter allow the user to insert and remove memory cards without any additional actions or attention required by the user to adapter assembly 100. As such, side rails 116a, 116b are configured to disable (i.e., render ineffective) ejector mechanisms provided within an ExpressCard slot.

Figure 5:
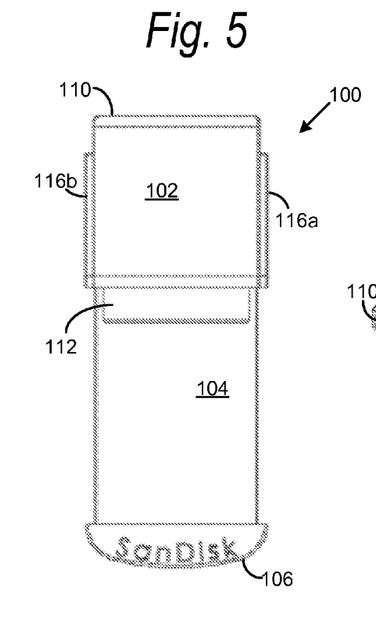
FIG. 5 is a top view of an adapter according to embodiments of the present invention.
Figure 6:
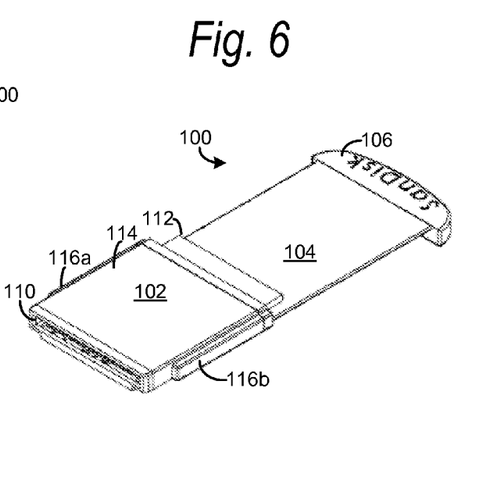
FIG. 6 is a perspective view of an adapter according to embodiments of the present invention.
Figure 7:
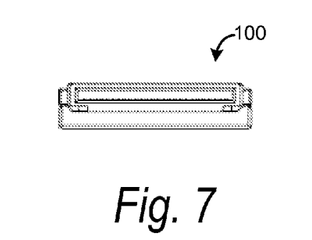
FIG. 7 is an end view of an adapter according to embodiments of the present invention.
Figure 8:
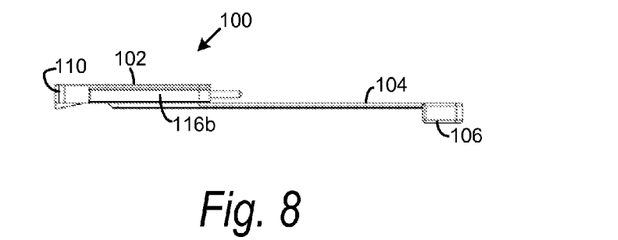
FIG. 8 is a side view of an adapter according to embodiments of the present invention.

In order to disable ExpressCard slot ejector mechanisms, side rails 116a, 116b are provided with a length sufficient to allow sturdy insertion and removal as well as frictional engagement with the ExpressCard slot, but also terminate short of the front section of adapter 102. In particular, as best seen in FIGS. 5, 6 and 8, side rails 116a, 116b extend from a back portion of housing 114 but terminate short of the front end of the adapter 102. Conventional ejector mechanisms operate by engaging portions of the front of an ExpressCard memory card. By terminating side rails 116a, 116b short of the front of adapter 102, there is no portion of the adapter assembly which may be engaged by the ejector mechanisms in a conventional ExpressCard slot. Termination of the side rails 116a, 116b prevents engagement of the assembly 100 with a cantilever in a conventional push button-type ejector mechanism, and termination of the side rails 116a, 116b prevents engagement of the assembly 100 with the translating tab in a conventional push-push ejector mechanism.

As some ExpressCard slots may have their ejector mechanisms on the left side and some on the right side, both side rails 116a and 116b terminate before the front of adapter 102 to defeat the ejector mechanism whether it is located on the left or right side of the card slot. However, for example where an adapter assembly 100 is going to be used within card slots having the ejector mechanism always on the same side, the side rail on that side may terminate short of the front of the adapter, and the side rail on the opposite side may extend all the way to the front of the adapter in alternative embodiments.

In embodiments, side rails 116a and 116b are long enough to ensure a sturdy insertion/removal and frictional engagement of the adapter assembly with the host slot, but are short enough to defeat the ejector mechanism as described above. In embodiments, side rails 116a, 116b may have a length from the back of housing 114 of between 20 mm and 10 mm, and in further embodiments, between 18 mm and 15 mm. It is understood that the length of side rails 116a and 116b may be shorter or longer than the ranges set forth above in alternative embodiments, as long as they fulfill the above-described objectives for side rails 116a and 116b.

Tongue 104 may be integrally formed or otherwise attached to adapter 102. The tongue 104 may be formed of a rigid material such as for example metal, plastic or other polymer, and may be the same material as or different from the material of housing 114. In embodiments, tongue 104 may have a length of 45 mm so as to extend from adapter 102 to the front opening of the ExpressCard slot. Thus, the adapter 102 and tongue 104 together extend the entire 75 mm length of a standard ExpressCard slot. The width of tongue 104 may be the width of the ExpressCard slot, e.g., 34 mm. It is understood that the width of tongue 104 need not extend across the entire width of the ExpressCard slot and may be less than 34 mm in further embodiments.

The thickness of tongue 104 may for example be 1 mm. As explained hereinafter, a memory card 130 is received within the ExpressCard slot on top of tongue 104. Accordingly, the combined thickness of tongue 104 and the memory card 130 must be less than or equal to the height of an ExpressCard slot, e.g., 5 mm. In embodiments where a memory card is provided having a thickness less than 4 mm, the thickness of tongue 104 may be greater than 1 mm. Alternatively, it is understood that tongue 104 may be thinner than 1 mm in alternative embodiments, with the provision that tongue 104 have sufficient rigidity to transmit an insertion force exerted on grip 106 as explained below.

In the embodiments described above, the tongue 104 is provided beneath the memory card 130. In further embodiments of the present invention, it is understood that the tongue may be configured to cover two, three or all four sides of a memory card and be used within an ExpressCard slot. For example, tongue 104 may be a continuation of the housing 114 and the two may extend the full length of the ExpressCard slot. In such an embodiment, a back end of tongue 104 may have an opening for receiving a memory card. Such a memory card may be inserted into the tongue and engage with interface 112 as described above.

Adapter assembly 100 may be inserted into an ExpressCard slot one of two ways. In a first insertion configuration, the adapter assembly 100 may be inserted into an ExpressCard slot without a memory card affixed thereto. In such an insertion configuration, a user slides the front end of the adapter assembly 100 into the ExpressCard slot, and then pushes on finger grip 106 to bring interface 110 into full engagement with the connector pins within the ExpressCard slot. In such an insertion configuration, tongue 104 must have sufficient rigidity to translate the insertion force exerted on grip 106 to the front interface 110 without buckling.

In a second insertion configuration, a memory card may be affixed onto adapter assembly 100 by seating male connectors of interface 112 within the female connectors of the memory card 130. Upon affixing a memory card 130 to adapter assembly 100, the adapter assembly 100 and memory card 130 together have a form factor of a conventional ExpressCard memory card. In the second insertion configuration, the joined adapter assembly and memory card may then together be inserted into the ExpressCard slot.

It is understood that the rigidity of tongue 104 need not be as high in the second insertion configuration as compared to the rigidity of the tongue 104 necessary in the first insertion configuration. In particular, in the second insertion configuration, the memory card may largely prevent buckling of the tongue 104. While it may be desirable to provide tongue 104 with rigidity sufficient to handle both the first and second insertion configurations, embodiments of the invention may include a tongue having rigidity sufficient to operate with only the second insertion configuration.

Finger grip 106 is affixed to tongue 104 and protrudes from the front opening of the memory card slot when the adapter assembly 100 is fully inserted within the slot. Grip 106 is provided for removal, and, in embodiments, insertion of adapter assembly 100. As explained above, the adapter assembly 100 is a set-it-and-forget-it device which does not get displaced upon insertion or removal of a memory card. However, when a user desires, the user may remove the adapter assembly 100 from the ExpressCard slot by grasping the finger grip 106 and manually pulling the adapter assembly 100 out of the slot. Also, as explained above, grip 106 may be held by a user to insert adapter assembly 100 into the fully engaged position within the ExpressCard slot.

Grip 106 may be formed to various sizes and of various materials, including for example rubber, metal, plastic or other polymers. In embodiments, grip 106 will have an upper surface level with an upper surface of tongue 104 so that grip 106 does not interfere with a memory card being coupled to adapter assembly 100. When adapter assembly 100 is in use, grip 106 is the only portion of the assembly protruding from the ExpressCard slot. Grip 106 may include a brand or other marking which is visible while the adapter assembly is fully inserted within the ExpressCard slot.

Figure 9:
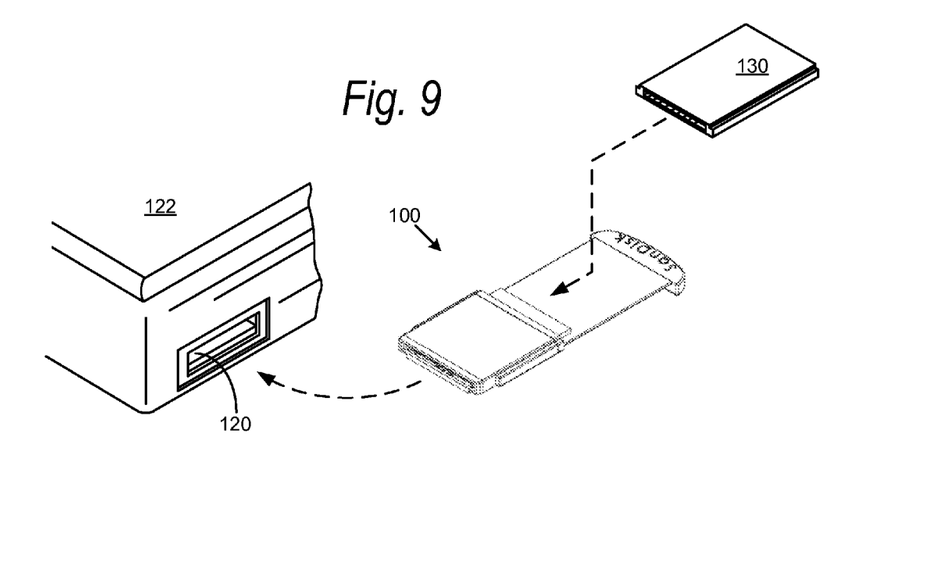
FIG. 9 is a perspective view showing an adapter according to the present invention and a memory card for use therewith adjacent an ExpressCard slot of a host computing device.

FIG. 9 is a perspective view showing an adapter assembly 100 positioned adjacent to a slot 120 of a host device 122, which may for example be a notebook computer, a desktop computer or other computing device that may include an ExpressCard slot. FIG. 9 further shows a memory card 130 adjacent adapter assembly 100. As discussed above, in a first insertion configuration, the adapter assembly 100 may be inserted by itself into slot 120, and thereafter the card 130 inserted into the slot. In a second insertion configuration, memory card 130 may first be joined to adapter assembly 100, and then the adapter assembly 100 and memory card 130 inserted together into ExpressCard slot 120.

Figure 10:
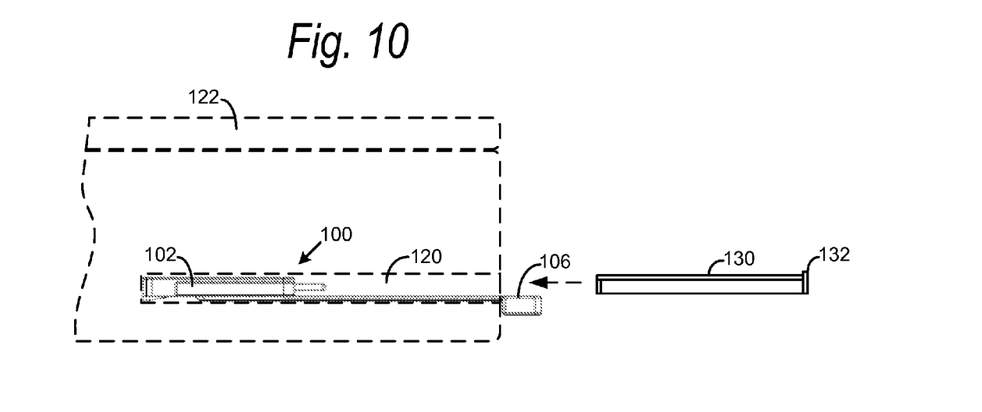
FIG. 10 is side cross-sectional view of an ExpressCard slot within a host computing device including an adapter according to embodiments of the present invention.

FIG. 10 shows a cross-sectional side view of host device 122 with the adapter assembly 100 seated within the ExpressCard slot 120. As seen in FIG. 10, adapter assembly 100 effectively converts an ExpressCard slot into a slot capable of operating with memory cards of shorter length than conventional ExpressCard memory cards. In the embodiments described above, adapter 102 has a length of 30 mm and memory card 130 has a length of 45 mm. However, it is understood that the respective lengths of adapter 102 and memory card 130 may vary, but together they equal the length of slot 120 e.g., 75 mm. Moreover, in embodiments where adapter assembly 100 and card 130 are used in slots other than an ExpressCard slot, it is understood that the combined length of the adapter assembly 100 and card 130 may be less than or greater than 75 mm.

When card 130 is pulled out of the slot 120, for example by lip 132, a frictional engagement force between side rails 116a and 116b and the respective channels in slot 120 is greater than the frictional engagement force between the connectors of interface 112 and the female connector of memory card 130. Accordingly, when card 130 is pulled out, adapter assembly 100 remains securely within its affixed position in ExpressCard slot 120. In an alternative embodiment, it is further understood that a locking mechanism as is known in the art may be included as part of, or to operate with, adapter assembly 100 to lock the adapter assembly 100 within the ExpressCard slot 120.

As discussed above, the lip 132 on card 130 may be used to pull the card out of the slot 120. However, in further embodiments of the present invention, a push-push mechanism as described above or otherwise may be mounted to a side portion of housing 114, such as for example as part of, or within, one of side rails 116a or 116b. In such embodiments, the memory card 130 may be locked within and ejected from slot 120 by the push-push mechanism while the adapter assembly 100 remains in a fixed position within slot 120.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory card system comprising:
   a memory card having dimensions approximating that of a CompactFlash card, the memory card configured for use within an ExpressCard slot; and
   an adapter assembly for adapting the memory card for use within an ExpressCard slot, the adapter assembly including:
      an adapter having a first interface for connecting to the ExpressCard slot and a second interface for connecting to the memory card;
      a finger grip, spaced from the adapter, for being gripped by a user in order to remove the adapter assembly from the ExpressCard slot;
      a tongue rigidly connected between the adapter and finger grip, the memory card positioned over the tongue to mate with the second interface; and
      a light emitting diode (LED) on a back end of the memory card for indicating data exchange to and from the memory card.

2. The memory card recited in claim 1, wherein the memory card and tongue together have a height of a standard ExpressCard memory card.

3. The memory card recited in claim 2, wherein the memory card and tongue together have a height of approximately 5 mm.

* * * * *